US012796543B2

(12) United States Patent
Cheah et al.

(10) Patent No.: US 12,796,543 B2
(45) Date of Patent: Nov. 10, 2026

(54) ARCHITECTURES FOR MEMORY ON INTEGRATED CIRCUIT DEVICE PACKAGES COMPRISING A MOLD LAYER HAVING A RECESS

(71) Applicant: Intel Corporation, Santa Clara, CA (US)

(72) Inventors: Bok Eng Cheah, Gelugor (MY); Seok Ling Lim, Kulim (MY); Jenny Shio Yin Ong, Bayan Lepas (MY); Kooi Chi Ooi, Bukit Gambir (MY); Jackson Chung Peng Kong, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/091,228

(22) Filed: Dec. 29, 2022

(65) Prior Publication Data

US 2024/0222346 A1 Jul. 4, 2024

(51) Int. Cl.

*H10W 90/00* (2026.01)
*H10W 74/01* (2026.01)
*H10W 74/10* (2026.01)
*H10W 70/60* (2026.01)
*H10W 72/20* (2026.01)

(52) U.S. Cl.

CPC ........... *H10W 90/00* (2026.01); *H10W 74/01* (2026.01); *H10W 74/111* (2026.01); *H10W 70/60* (2026.01); *H10W 72/227* (2026.01); *H10W 90/724* (2026.01)

(58) Field of Classification Search

CPC ..................................................... H10W 90/00
USPC .......................................................... 257/668
See application file for complete search history.

(56) References Cited

U.S. PATENT DOCUMENTS

| | | | | |
|---|---|---|---|---|
| 2020/0006246 | A1* | 1/2020 | Kong | H10W 42/121 |
| 2024/0006376 | A1* | 1/2024 | Lim | H10W 90/00 |
| 2024/0145450 | A1* | 5/2024 | Kuan | H10W 42/121 |

* cited by examiner

*Primary Examiner* — Ajay Arora
(74) *Attorney, Agent, or Firm* — Essential Patents Group, LLP

(57) ABSTRACT

An apparatus is provided which comprises: a first package, a second package coupled with the first package, the second package comprising a mold layer having a recess on a first mold surface, a first plurality of devices adjacent to the recess and a metal redistribution layer (RDL) coupled to a second mold surface opposite the first mold surface, wherein the mold layer includes a first thickness, wherein the recess includes a second thickness, and wherein the second thickness is less than the first thickness, and an integrated circuit device coupled with both the second package at the recess and with the first package through a plurality of solder bumps. Other embodiments are also disclosed and claimed.

18 Claims, 9 Drawing Sheets

ARCHITECTURES FOR MEMORY ON INTEGRATED CIRCUIT DEVICE PACKAGES COMPRISING A MOLD LAYER HAVING A RECESS

BACKGROUND

Computing platforms, such as desktops, laptops or smart phones, for example, are expected to have increased performance compared with previous iterations. One way that manufacturers of computing platforms can achieve increased performance is by integrating more integrated circuit devices into a single package. Heterogeneous integration refers to the integration of separately manufactured components into an assembly that, in the aggregate, provides enhanced functionality and improved operating characteristics. As more computing cores are integrated into a package, or system on a chip, there arises a need to integrate more memory components into the package as well. With increased integration, there can arise issues with signal integrity and power delivery within device packages. Therefore, there is a need for high performance architectures that address these issues.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
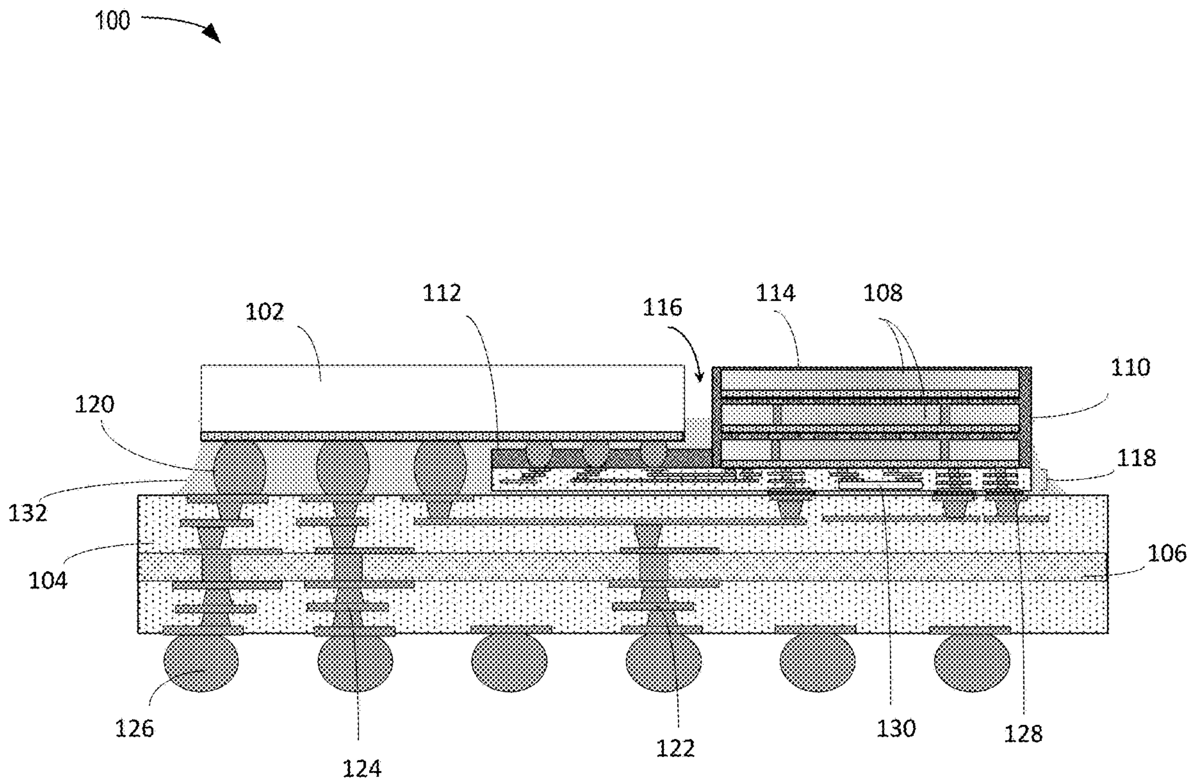
FIG. 1 illustrates a cross-sectional view of an example architecture for memory on an integrated circuit device package, according to some embodiments.

Architectures for memory on integrated circuit device packages are generally presented. In this regard, embodiments of the present disclosure enable high bandwidth memory to be closely integrated with a processor. One skilled in the art would appreciate that embodiments presented herein may enable device miniaturization through direct interconnects between a central processing unit/system-on-a-chip (CPU/SOC) and their associated memory devices through recessed wafer-level package architecture, thereby allowing z-height reduction through elimination of solder ball associated to the on-package memory device and reduced keep-out zones (KOZ) between adjacent components (e.g., gaps between the CPU/GPU and the memory DRAM components), as well as package substrate layer count reduction i.e., routing interconnects through the metal redistribution layers (RDL). Additionally, the architectures described herein may offer enhanced electrical performance e.g., reduced signal latency between CPU, GPU or SOC and DRAM memory devices through shorter and less distorted signal transmission path i.e., direct signal interconnect between the processor and the multiple memory devices arranged thereby, as well as improved data transmission bandwidth through high-density metal RDL interconnects between CPU/SOC and DRAM devices.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left." "right." "front." "back." "top." "bottom." "over," "under," and the like in the description and in the claims, if any, are used for descriptive purposes and not necessarily for describing permanent relative positions.

FIG. 1 illustrates a cross-sectional view of an example architecture for memory on an integrated circuit device package, according to some embodiments. As shown, integrated circuit device package 100 may include integrated circuit device 102, package substrate 104, substrate core 106, stacked devices 108, mold material 110, recessed mold surface 112, upper mold surface 114, mold recess 116, redistribution layers 118, solder bumps 120, power routing 122, ground routing 124, solder balls 126, solder layer 128, passive component 130, and underfill material 132. Integrated circuit device package 100 demonstrates an electronic assembly with chip-on recessed memory package (Co-RMP) architecture for improved electrical performance and device miniaturization. In one aspect, integrated circuit device package 100 comprises a first package, such as package substrate 104, such as a multi-layer organic having a substrate core 106, a ceramic package, a silicon substrate, or a glass substrate and a second package e.g., a wafer level package attached to package substrate 104. In an aspect, the second package includes a mold material 110 having a recessed mold surface 112 below upper mold surface 114, a first plurality of stacked devices 108 e.g., a dynamic random accessed memory (DRAM) device or a high bandwidth memory (HBM) device adjacent to the recess and a metal redistribution layer (RDL) 118 coupled to a second mold surface opposite the first mold surface. In an aspect, mold material 110 includes a first thickness ranging from 200 μm-500 μm at upper mold surface 114, and the recess includes a second thickness less than the first thickness, e.g., ranging from 30 μm-150 μm, at recessed mold surface 112.

In an aspect, recessed mold surface 112 includes a plurality of mold openings extending from recessed mold surface 112 to redistribution layer 118. In an aspect, each of the mold opening at least partially exposes a contact pad of the metal RDL 118 at the second mold surface. In an aspect, integrated circuit device 102 may represent a central processing unit (CPU), a system-on-chip (SOC), a graphic processing unit (GPU), a deep learning processor (DLP) and/or a neural network processor (NNP) is coupled with package substrate 104 and to the second package at the recessed mold surface 112 through a plurality of solder bumps 120. In an aspect, the plurality of solder bumps 120 includes a first plurality of solder bumps having a first diameter e.g., ranging from 10 μm to 30 μm, coupling integrated circuit device 102 with redistribution layers 118, and a second plurality of solder bumps having a second diameter greater than the first diameter, e.g., ranging from 50 μm to 100 μm, coupling integrated circuit device 102 with package substrate 104. In an aspect, integrated circuit device 102 is communicatively coupled stacked devices 108 through the metal RDL 118 and the first plurality of solder bumps, for example, for electrical data transmission. In an aspect, the first plurality of solder bumps resides at least partially within the plurality of mold openings. In an aspect, an underfill material 132 e.g., an epoxy polymer layer may extend at least partially across the first and second plurality of solder bumps 120, package substrate 104 metal RDL 118 to provide mechanical support.

In an aspect, the metal RDL 118 is coupled to package substrate 104, for example, through a solder layer 128 to facilitate power delivery from package substrate 104 to the stacked devices 108 in the second package. Power routing 122 may facilitate power delivery through package substrate 104 to both integrated circuit device 102 and stacked devices 108. In an aspect, the metal RDL 118 further includes one or more passive components 130 e.g., a capacitor, an inductor, a resistor, or a voltage regulator for improved power delivery or electrical performance.

Figure 2A:
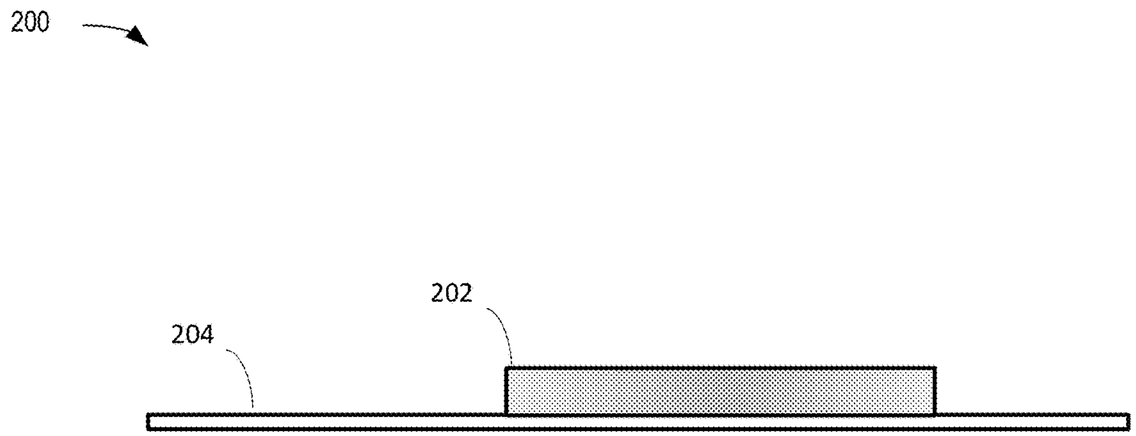
FIGS. 2A-2H illustrate cross-sectional views of example manufacturing steps of forming an architecture for memory on an integrated circuit device package, according to some embodiments.

FIGS. 2A-2H illustrate views of example manufacturing steps of forming an architecture for memory on an integrated circuit device package, according to some embodiments. As shown in FIG. 2A, assembly 200 includes first device 202, for example a memory device, attached to carrier 204. In some embodiments, first device 202 is temporarily bonded to carrier 204, which may be glass.

Figure 2B:
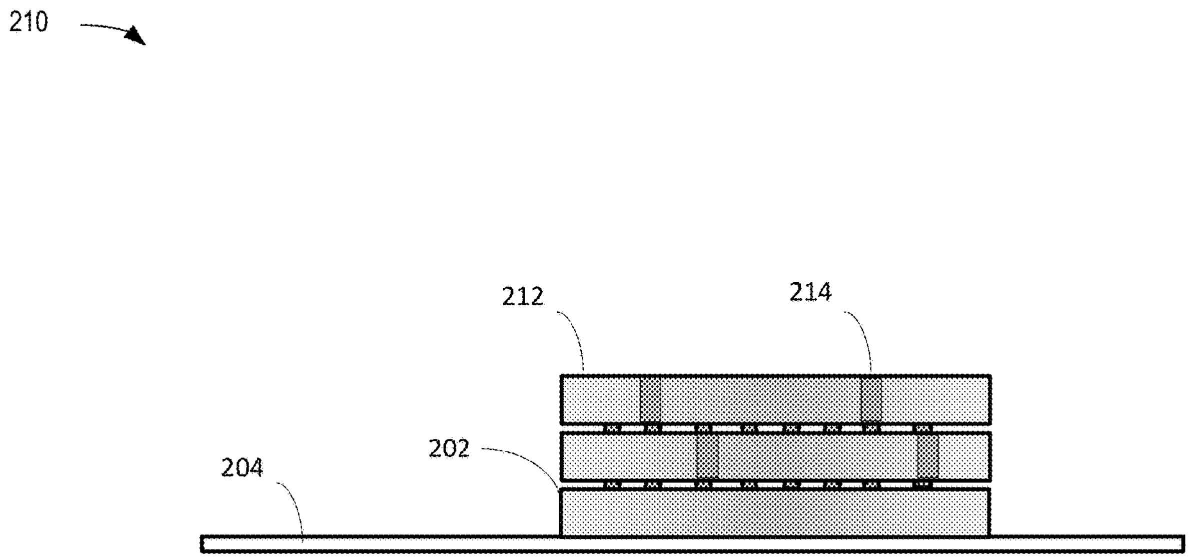

FIG. 2B shows assembly 210, which may include stacked devices 212 attached to first device 202. In some embodiments, stacked devices 212 may be communicatively coupled with each other by through silicon vias 214. In some embodiments, stacked devices 212 may be soldered or hybrid bonded together, with or without underfill material there between.

Figure 2C:
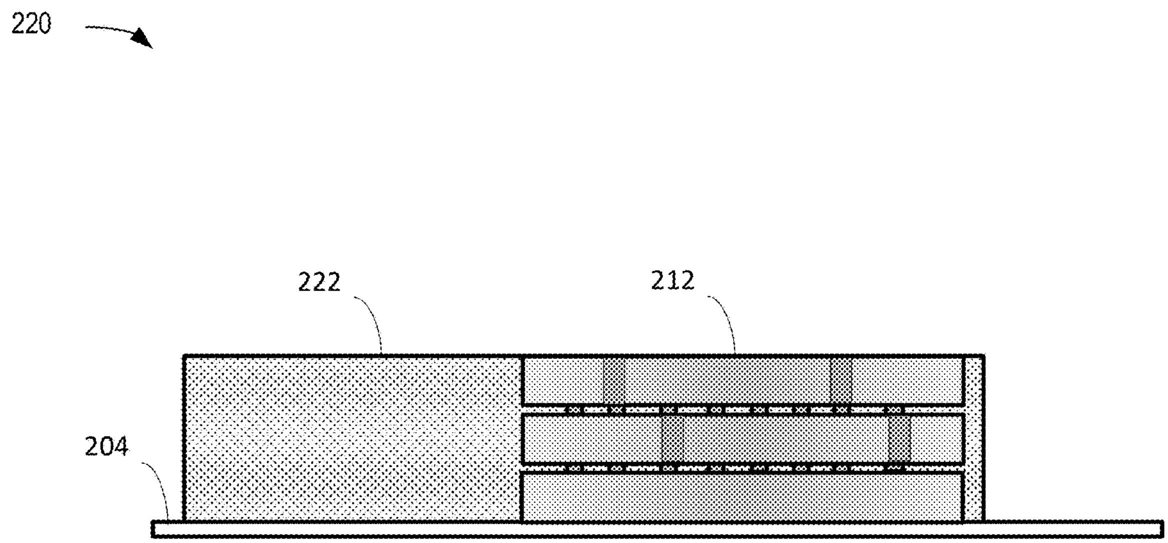

As shown in FIG. 2C, assembly 220 may include mold material 222 surrounding stacked devices 212. In some embodiments mold material 222 may be applied over stacked devices 212 and then is planarized to expose contacts on a surface of stacked devices 212. While shown as extending laterally to one side of stacked devices 212, in some embodiments, molder material 222 may extend laterally to more or fewer sides of stacked devices 212.

Figure 2D:
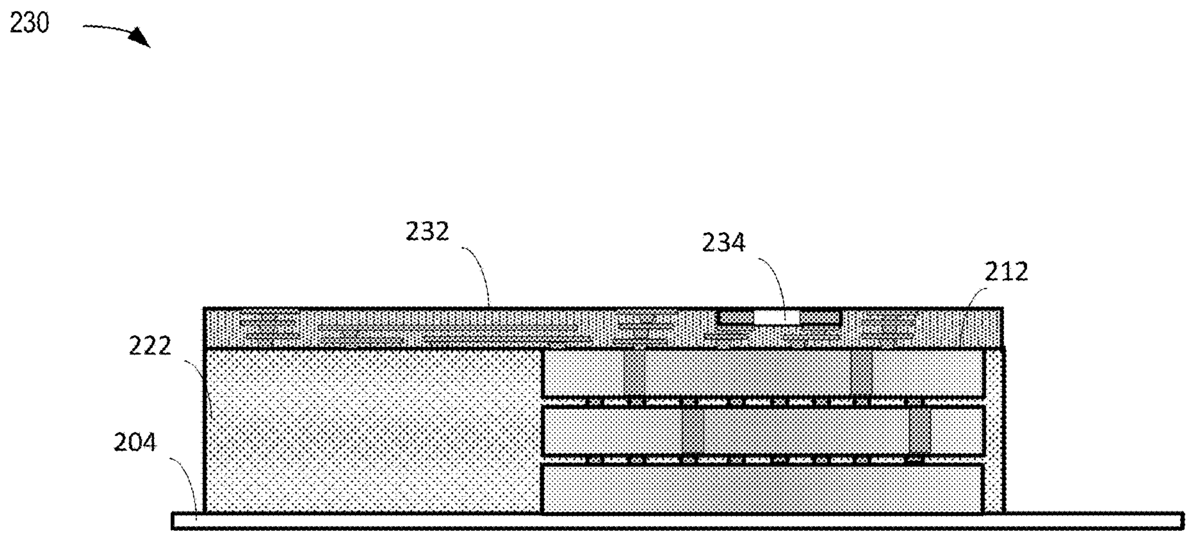

Turning now to FIG. 2D, assembly 230 may include redistribution layers 232 formed on stacked devices 212 and mold material 222. In some embodiments, redistribution layers 232 may include one or more passive components 234, which may represent a capacitor, resistor, inductor, or other passive component. In some embodiments, redistribution layers 232 are iteratively formed layers of metal and dielectric material, which may be organic or inorganic dielectric material.

Figure 2E:
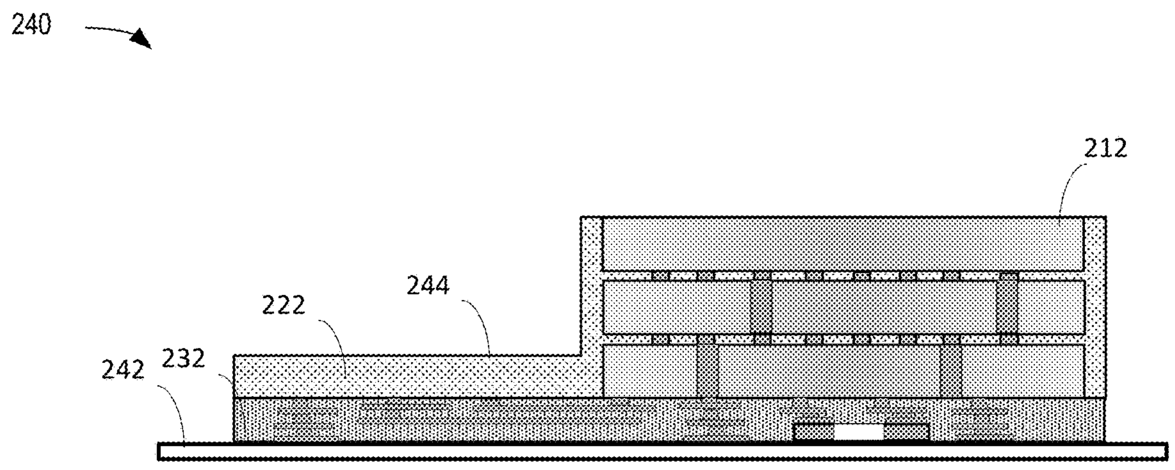

FIG. 2E shows assembly 240, which may include recessed mold surface 244 that was created by removing a portion of mold material 222. In some embodiments, assembly 230 was removed from carrier 204, inverted, and then bonded with carrier 242 for further processing. In some embodiments, recessed mold surface 244 creates a second substantially uniform thickness of mold material 232, which is less than the thickness of mold material 232 immediately surrounding stacked devices 212. In some embodiments, recessed mold surface 244 may be very near or even at a surface of redistribution layers 232, perhaps leaving no trace of mold material 232.

Figure 2F:
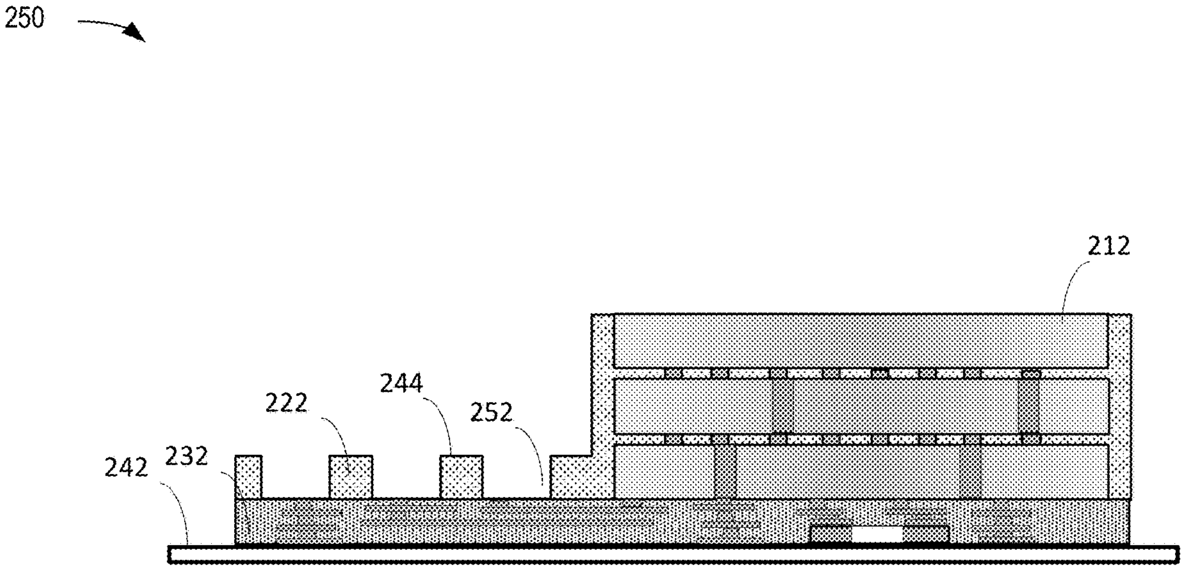

As shown in FIG. 2F, assembly 250 includes openings 252 formed in recessed mold surface 244. In some embodiments, openings 252 extend from recessed mold surface 244 to exposed contacts on redistribution layers 232. In some embodiments, openings 252 may be formed by any known chemical or mechanical methods, including, for example, etching or laser drilling.

Figure 2G:
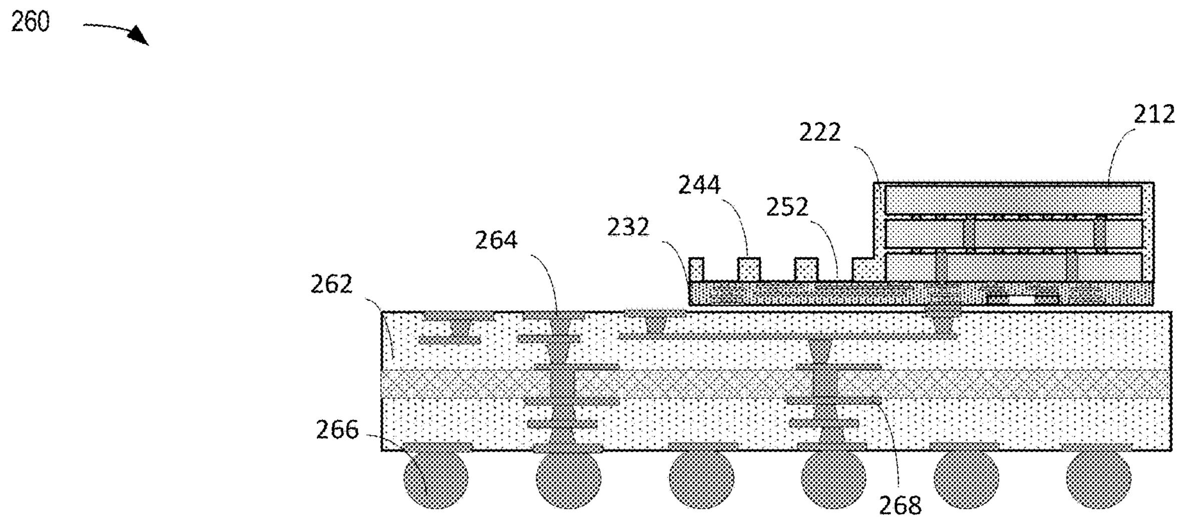

FIG. 2G shows assembly 260, which may include package substrate 262, to which the stacked device assembly 250 is attached after being separated from carrier 242. In some embodiments, redistribution layers 232 may be soldered with surface contacts 264, which may be conductively coupled with solder balls 266 through package routing 268.

Figure 2H:
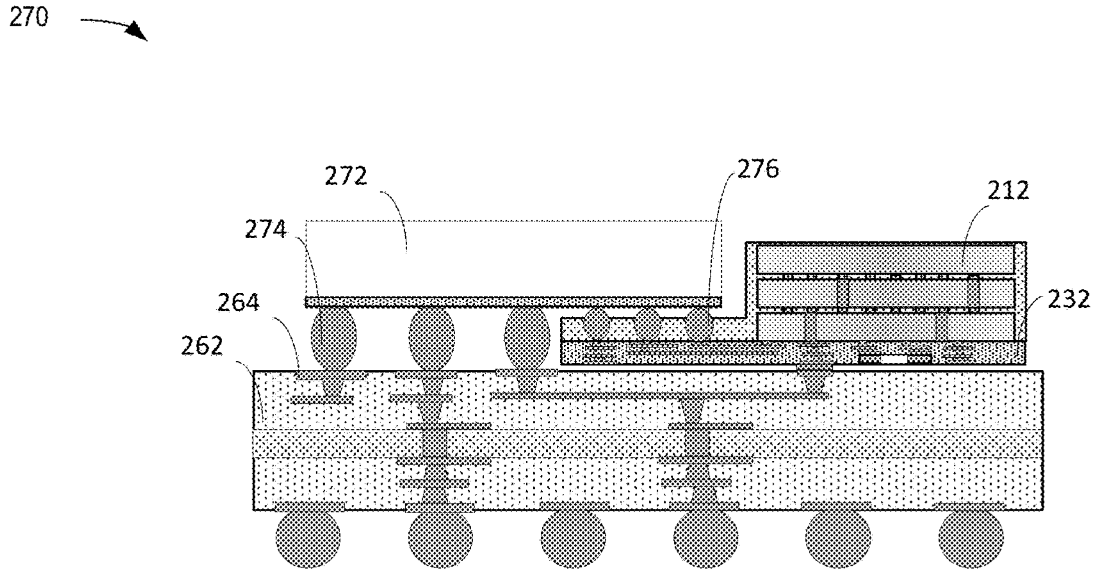

As shown in FIG. 2H, assembly 270 includes integrated circuit device 272 bonded with recessed mold surface 244 and package substrate 262. In some embodiments, solder bumps 274, which bond integrated circuit device 272 with package contacts 264, are larger than solder bumps 276, which bond integrated circuit device 272 with redistribution layers 232.

Figure 3:
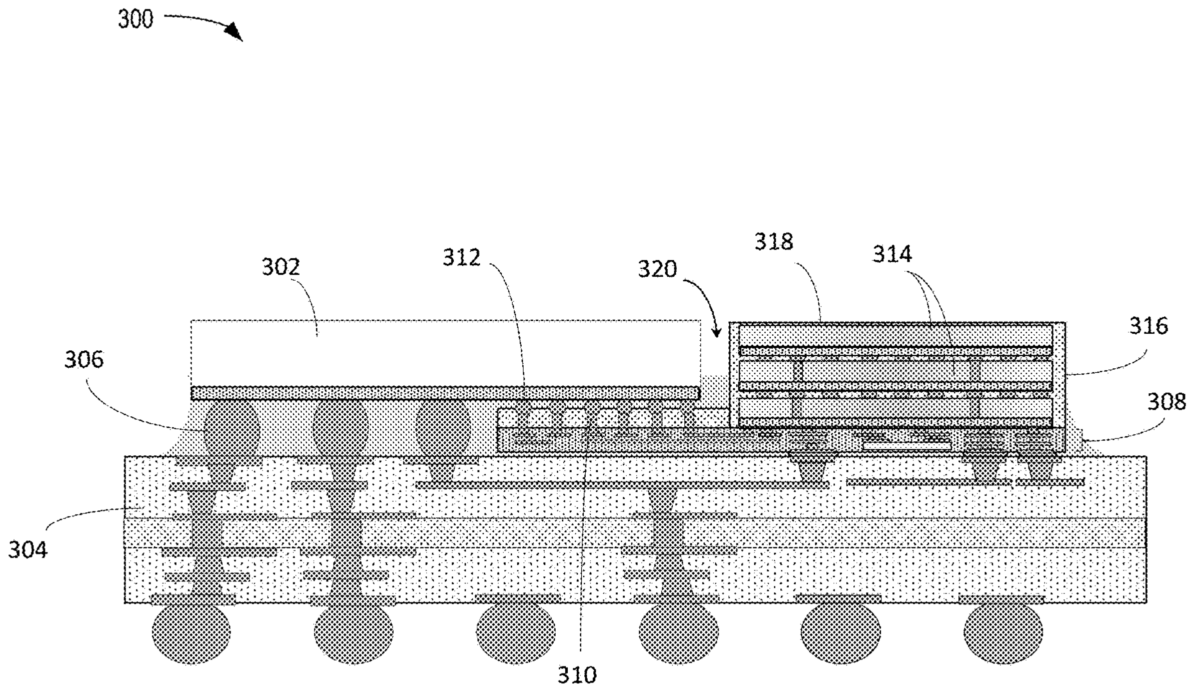
FIG. 3 illustrates a cross-sectional view of an example architecture for memory on an integrated circuit device package, according to some embodiments.

FIG. 3 illustrates a cross-sectional view of an example architecture for memory on an integrated circuit device package, according to some embodiments. As shown, integrated circuit device package 300 may include integrated circuit device 302, package substrate 304, larger solder bumps 306, redistribution layers 308, contact pads 310, smaller solder bumps 312, stacked devices 314, mold material 316, upper mold surface 318, and mold recess 320. Integrated circuit device package 300 illustrates an aspect wherein the mold material 316 further including a plurality of contact pads 310 at the mold recess 320 for improved routing density (e.g., by further reducing the diameter of the first plurality of solder bumps) between the silicon die and the plurality of dies in the second package. In an aspect, the plurality of contact pads 310, which may represent copper pillars, may include a thickness ranging from 20 μm to 100 μm.

While shown as including smaller solder bumps 312 bonding with redistribution layers 308 along one side of integrated circuit device 302, in some embodiments, smaller solder bumps 312 may be present and may bond with redistribution layers 308 along multiple sides of integrated circuit device 302. In this way, multiple iterations of stacked devices 314 may be communicatively coupled with integrated circuit device 302 in various geometric layouts on package substrate 304. For example, larger solder bumps 306 may be present, in some embodiments, adjacent a central portion of integrated circuit device 302 to bond with package substrate 304, while smaller solder bumps 312 may be present adjacent side regions of integrated circuit device 302 to bond with multiple redistribution layers 308. Also, while shown as being substantially level with a top surface of integrated circuit device 302, upper mold surface 318 may extend above or below a top surface of integrated circuit device 302.

Figure 4:
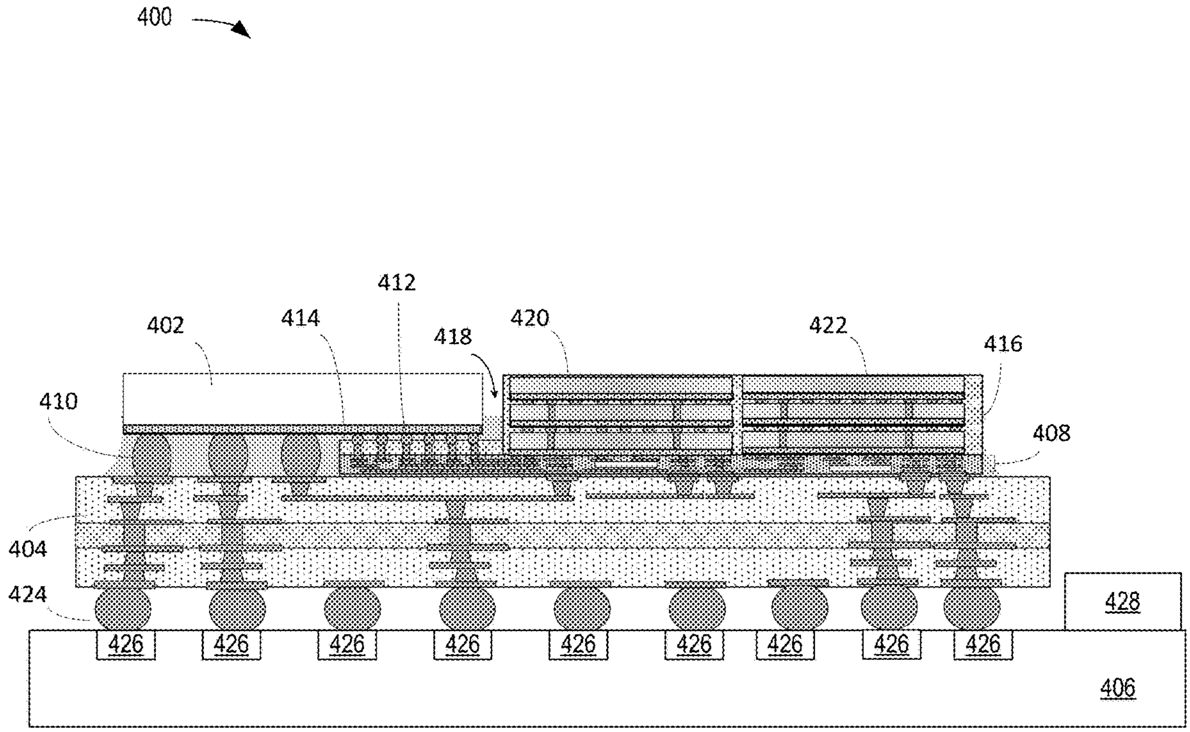
FIG. 4 illustrates a cross-sectional view of an example architecture for memory on an integrated circuit device package, according to some embodiments.

FIG. 4 illustrates a cross-sectional view of an example architecture for memory on an integrated circuit device package, according to some embodiments. As shown, assembly 400 may include integrated circuit device 402, package substrate 404, system board 406, redistribution layers 408, larger solder bumps 410, smaller solder bumps 412, recessed mold surface 414, mold material 416, mold recess 418, first device stack 420, second device stack 422, solder balls 424, board pads 426, and system component 428. Assembly 400 illustrates an aspect wherein the mold material 416 further encapsulates a second stack of devices 422 e.g., a dynamic random accessed memory (DRAM) device or a high bandwidth memory (HBM) device adjacent the first stack of devices 420 for increased system bandwidth performance and device miniaturization. In some embodiments, first device stack 420 and/or second device stack 422 may include homogeneous devices or heterogeneous devices either separately or in combination with each other. Keep-out zone between first device stack 420 and second device stack 422, for example, extending in the x-axis may be eliminated. In an aspect, the second stack of devices may be communicatively coupled to integrated circuit device 402 through the metal RDL 408 and the first plurality of smaller solder bumps 412. While shown as including 2 device stacks 420 and 422, in some embodiments, additional devices stacks may be included to one or more sides of integrated circuit device 402.

Assembly 400 may incorporate elements previously discussed in reference to prior figures. For example, elements of assembly 400 may have properties discussed in reference to FIG. 1, 2A-2H, or 3. In some embodiments, solder balls 424 may be formed on bottom surface contacts, thereby allowing the device package to be soldered to system board 406 through board pads 426. System board 406 may also incorporate board component 428, which may represent any type of active or passive system components, such as a power supply, connectors, voltage regulators, I/O interfaces, etc.

Figure 5:
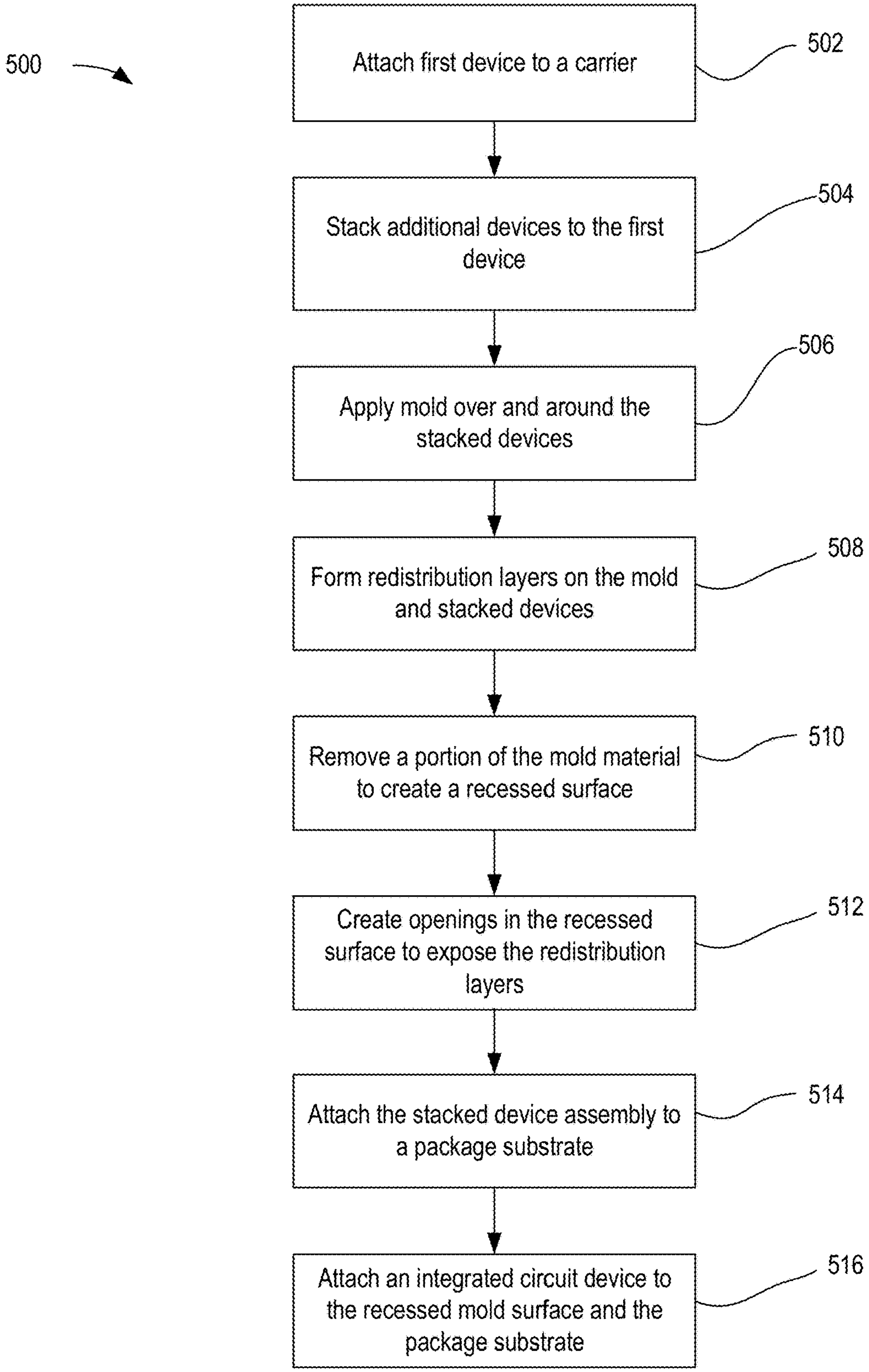
FIG. 5 illustrates a flowchart of a method of forming an architecture for memory on an integrated circuit device package, in accordance with some embodiments.

FIG. 5 illustrates a flowchart of a method of forming an architecture for memory on an integrated circuit device package, in accordance with some embodiments. Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 500 begins with attaching (502) a first device to a carrier. In some embodiments, such as assembly 200, a memory device 202 is temporarily bonded with a glass carrier 204. Next, additional devices are stacked (504) on the first device. In some embodiments, such as assembly 210, additional memory devices 212 are bonded with the first device 202.

Then, a mold material may be applied (506) over and around the stacked devices. In some embodiments, such as assembly 220, mold material 222 may be applied over stacked devices 212 and then planarized. Next, redistribution layers may be formed (508) on the mold material. In some embodiments, such as assembly 230, redistribution layers 232 may be formed over a length of the mold material 222 and the stacked devices 212.

The method continues, in some embodiments, with removing (510) a portion of the mold material to create a recessed surface. In some embodiments, such as assembly 240, after flipping the assembly a recessed surface 244 in the mold material 222 may span a width approximately equal to that of the stacked devices 212. Next, openings may be formed (512) in the recessed surface to expose the redistribution layers. In some embodiments, such as assembly 250, openings 252 extend through the mold material 222 from the recessed surface 244 to the redistribution layers 232.

Next, the device stack assembly may be attached (514) to a package substrate. In some embodiments, such as assembly 260, the redistribution layers 232 are bonded with contacts 264 on a surface of the package substrate 262. Finally, an integrated circuit device may be attached (516) to the recessed mold surface and the package substrate. In some embodiments, such as assembly 270, the integrated circuit device 272 is bonded with solder bumps 274 of a larger size to the package substrate 262 and solder bumps 276 of a smaller size to the recessed mold surface.

Figure 6:
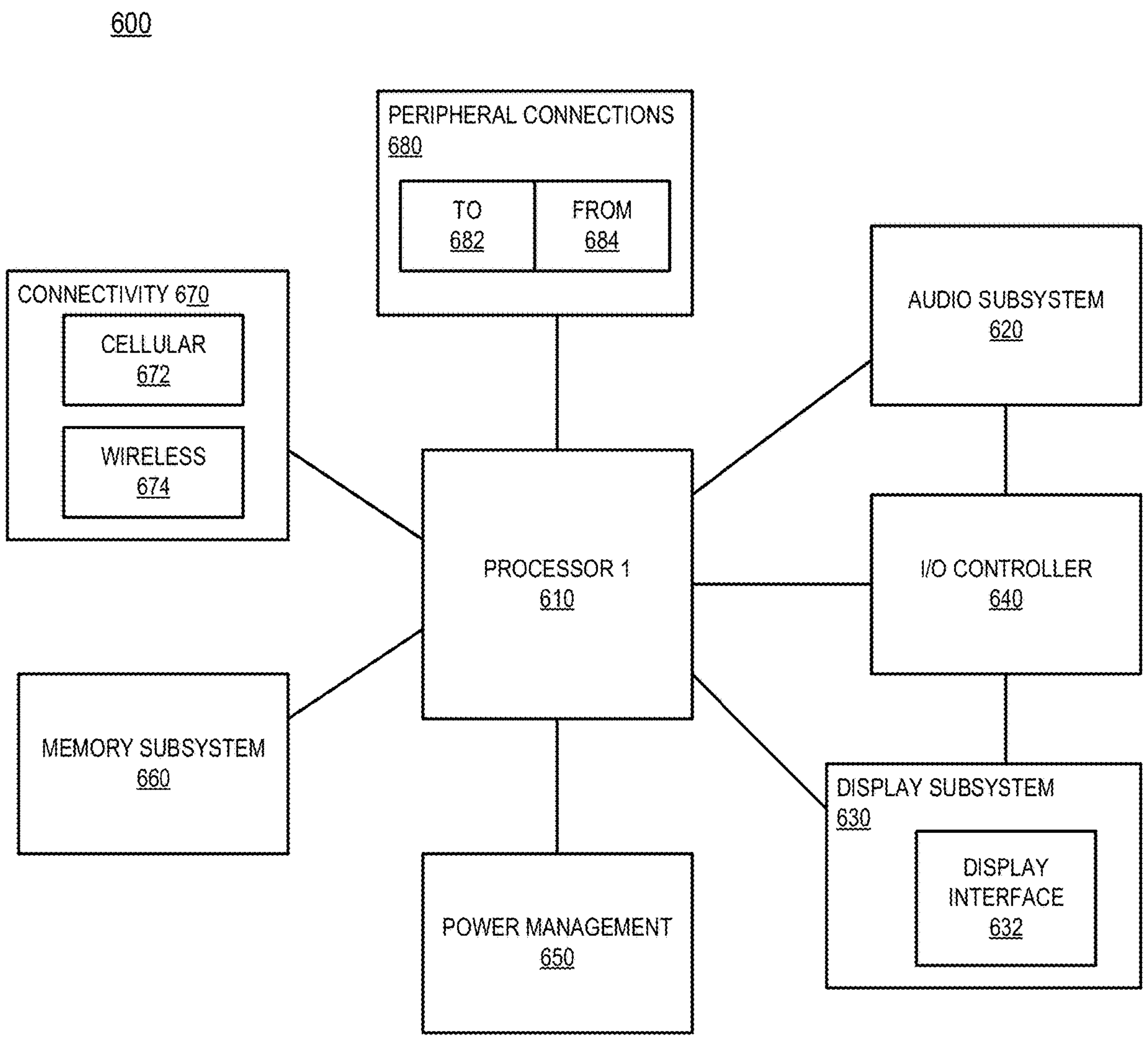
FIG. 6 illustrates a smart device or a computer system or a SoC (System-on-Chip) which includes an architecture for memory on an integrated circuit device package, according to some embodiments.

FIG. 6 illustrates a smart device or a computer system or a SoC (System-on-Chip) which includes an architecture for memory on an integrated circuit device package, according to some embodiments. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600. In some embodiments, one or more components of computing device 600, for example processor 610 or I/O controller 640, include an architecture for memory on an integrated circuit device package as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors- BJT PNP/NPN, BICMOS, CMOS, etc., may be used without departing from the scope of the disclosure.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMS, EPROMS, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Connectivity 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking"

connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment." "one embodiment," or "some embodiments" are not necessarily all referring to the same embodiments. If the specification states a component, feature, structure, or characteristic "may." "might." or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:

a first package;

a second package coupled with the first package, the second package comprising a mold layer having a recess on a first mold surface, a first plurality of devices adjacent to the recess and a metal redistribution layer (RDL) coupled to a second mold surface opposite the first mold surface, wherein the mold layer includes a first thickness, wherein the recess includes a second thickness, and wherein the second thickness is less than the first thickness; and an integrated circuit device coupled with both the second package at the recess and with the first package through a plurality of solder bumps.

2. The apparatus of claim 1, wherein the recess includes a plurality of mold openings extending from a recessed mold surface and each of the mold openings at least partially exposes a contact pad at the second mold surface.

3. The apparatus of claim 2, wherein each of the mold openings at least partially exposes a contact pad of the metal RDL.

4. The apparatus of claim 3, wherein the plurality of solder bumps comprises a first plurality of solder bumps having a first diameter and a second plurality of solder bumps having a second diameter, the second diameter greater than the first diameter, wherein the integrated circuit device is coupled with the second package at the recess through the first plurality of solder bumps, and wherein the integrated circuit device is coupled with the first package through the second plurality of solder bumps.

5. The apparatus of claim 4, wherein the first plurality of solder bumps is at least partially present within the plurality of mold openings.

6. The apparatus of claim 4, wherein the integrated circuit device is conductively coupled with the plurality of devices in the second package through the first plurality of solder bumps and the metal RDL.

7. The apparatus of claim 4, wherein the metal RDL further comprises one or more passive components.

8. The apparatus of claim 7, wherein the one or more passive components comprises a capacitor, an inductor, a resistor, or a voltage regulator.

9. The apparatus of claim 8, wherein the mold layer further comprises a second plurality of devices adjacent the first plurality of devices, wherein the second plurality of devices is coupled with the integrated circuit device through the metal RDL and the first plurality of solder bumps.

10. The apparatus of claim 9, wherein the integrated circuit device comprises one or more semiconductor die comprising a central processing unit (CPU), a system-on-chip (SOC), a graphic processing unit (GPU), a deep learning processor (DLP), or a neural network processor.

11. The apparatus of claim 9, wherein the plurality of devices comprises a dynamic random access memory (DRAM) device, or a high bandwidth memory (HBM) device.

12. A system comprising:

a host board;

an integrated circuit device package, the integrated circuit device package comprising:

a first package;

a second package attached on the first package, the second package comprising a mold layer having a recess on a first mold surface, a first plurality of devices adjacent to the recess and a metal redistribution layer (RDL) coupled to a second mold surface opposite the first mold surface, wherein the mold layer includes a first thickness, wherein the recess includes a second thickness, and wherein the second thickness is less than the first thickness; and an integrated circuit device coupled with both the second package at the recess and with the first package through a plurality of solder bumps; and a power supply to provide power to the integrated circuit device package through the host board.

13. The system of claim 12, wherein the recess includes a plurality of mold openings extending from a recessed mold surface and each of the mold openings at least partially exposes a contact pad of the metal RDL at the second mold surface.

14. The system of claim 12, wherein the plurality of solder bumps comprises a first plurality of solder bumps having a first diameter and a second plurality of solder bumps having a second diameter, the second diameter greater than the first diameter, wherein the integrated circuit device is coupled with the second package at the recess through the first plurality of solder bumps, and wherein the integrated circuit device is coupled with the first package through the second plurality of solder bumps.

15. The system of claim 12, wherein the integrated circuit device is conductively coupled with the plurality of devices in the second package through the first plurality of solder bumps and the metal RDL.

16. The system of claim 12, wherein the mold layer further comprises a second plurality of devices adjacent the first plurality of devices, wherein the second plurality of devices is coupled with the integrated circuit device through the metal RDL and the first plurality of solder bumps.

17. The system of claim 12, wherein the integrated circuit device comprises one or more semiconductor die comprising a central processing unit (CPU), a system-on-chip (SOC), a graphic processing unit (GPU), a deep learning processor (DLP), or a neural network processor.

18. The system of claim 12, wherein the plurality of devices comprises a dynamic random access memory (DRAM) device, or a high bandwidth memory (HBM) device.

* * * * *